(12) United States Patent
Matsumoto

(10) Patent No.: US 10,474,308 B2
(45) Date of Patent: Nov. 12, 2019

(54) POSITION DETECTION SENSOR AND METHOD FOR MANUFACTURING POSITION DETECTION SENSOR

(71) Applicant: Wacom Co., Ltd., Saitama (JP)

(72) Inventor: Yoshiharu Matsumoto, Saitama (JP)

(73) Assignee: WACOM CO., LTD., Saitama (JP)

( * ) Notice: Subject to any disclaimer, the term of this patent is extended or adjusted under 35 U.S.C. 154(b) by 85 days.

(21) Appl. No.: 15/804,553

(22) Filed: Nov. 6, 2017

(65) Prior Publication Data

US 2018/0059828 A1    Mar. 1, 2018

Related U.S. Application Data

(63) Continuation of application No. PCT/JP2016/063625, filed on May 6, 2016.

(30) Foreign Application Priority Data

Jun. 1, 2015 (JP) ................. 2015-111024

(51) Int. Cl.
*G06F 3/041* (2006.01)
*G06F 3/046* (2006.01)
*H05K 1/02* (2006.01)
*H05K 3/10* (2006.01)
*H05K 3/28* (2006.01)

(52) U.S. Cl.
CPC .......... *G06F 3/046* (2013.01); *H05K 1/0296* (2013.01); *H05K 3/10* (2013.01); *H05K 3/28* (2013.01); *G06F 2203/04103* (2013.01); *H05K 2201/09218* (2013.01)

(58) Field of Classification Search
CPC .......... G06F 3/046; G06F 3/041; G06F 3/045; H05K 1/02; H05K 3/28; H05K 3/10
See application file for complete search history.

(56) References Cited

U.S. PATENT DOCUMENTS 8,860,436 B2    10/2014 Kobori et al.
9,441,992 B2     9/2016 Matsumoto
(Continued)

FOREIGN PATENT DOCUMENTS

JP    5-42510 Y2    10/1993
JP    7-253840 A    10/1995
(Continued)

*Primary Examiner* — Pegeman Karimi
(74) *Attorney, Agent, or Firm* — Seep IP Law Group LLP

(57) ABSTRACT

A terminal, in which terminal conductors are disposed, is preliminarily formed on one surface of a substrate. Electrode conductors including covered lead wires are disposed in a region on the one surface of the substrate that does not overlap the terminal, the electrode conductors being bonded to the substrate by an adhesive material to form a predetermined conductor pattern, whereby a sensor pattern is disposed on the substrate. The lead wires of the electrode conductors are exposed due to the covering being removed at ends of the covered lead wires, the exposed lead wires are disposed while being aligned with and connectable to the corresponding terminal conductors of the terminal. The terminal conductors of the terminal and respective exposed lead wires of the electrode conductors of the sensor pattern are then electrically connected.

6 Claims, 7 Drawing Sheets

(56) References Cited

U.S. PATENT DOCUMENTS

| | | | | |
|---|---|---|---|---|
| 2008/0106522 A1* | 5/2008 | Nishikawa | .............. | G06F 3/045 345/173 |
| 2014/0307396 A1* | 10/2014 | Lee | ........................ | H05K 1/028 361/749 |
| 2015/0027232 A1* | 1/2015 | Matsumoto | ............. | G01F 1/582 73/861.11 |
| 2016/0154510 A1* | 6/2016 | Ide | .......................... | B32B 37/12 345/174 |
| 2016/0291723 A1* | 10/2016 | Kurasawa | ................ | G06F 3/044 |
| 2017/0350686 A1* | 12/2017 | Otaka | ........................ | G01B 7/16 |
| 2017/0357353 A1* | 12/2017 | Katsuta | ................. | G06F 3/0412 |

FOREIGN PATENT DOCUMENTS

| | | |
|---|---|---|
| JP | 2520813 Y2 | 10/1996 |
| JP | 9-190269 A | 7/1997 |
| JP | 2001-43004 A | 2/2001 |
| JP | 2013-186784 A | 9/2013 |
| JP | 2015-26235 A | 2/2015 |

\* cited by examiner

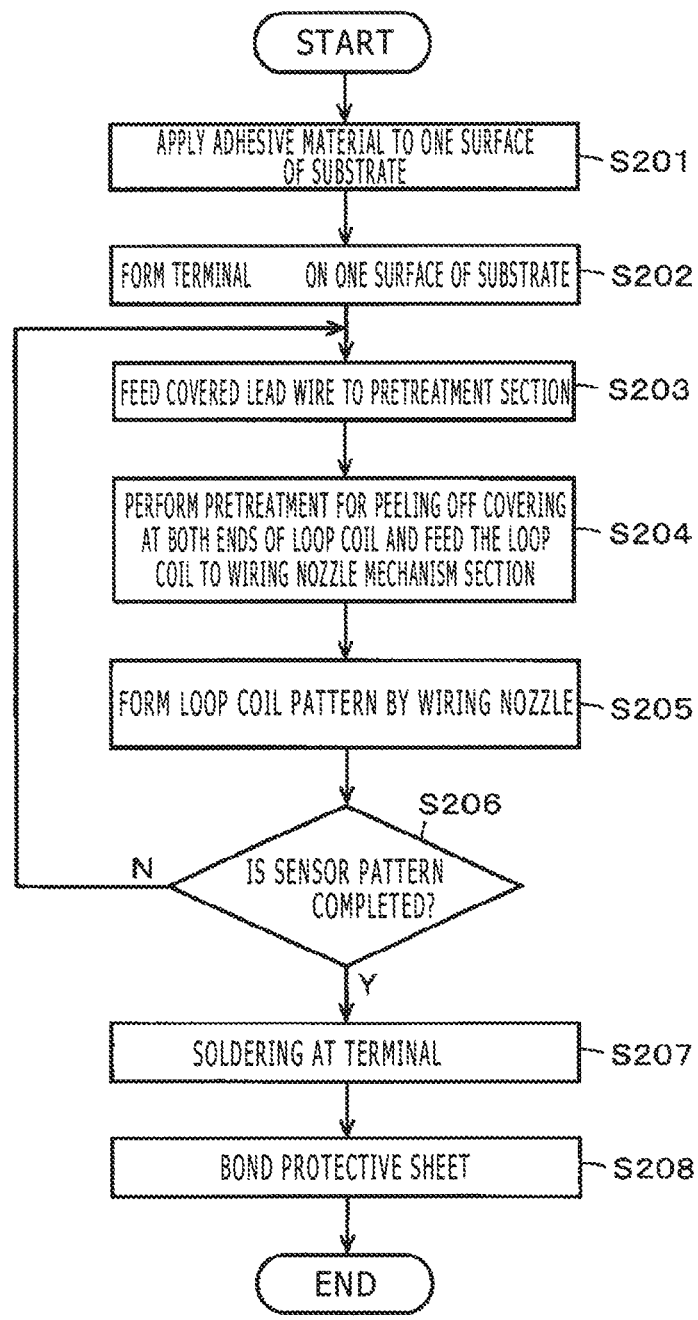

POSITION DETECTION SENSOR AND METHOD FOR MANUFACTURING POSITION DETECTION SENSOR

BACKGROUND

Technical Field

The present disclosure relates to a position detection sensor in which a plurality of electrode conductors is disposed on a substrate for detecting a position indicated by a position indicator, and a method for manufacturing the position detection sensor.

Background Art

Conventionally, in this kind of position detection sensor, generally, the plurality of electrode conductors is formed on a sheet-shaped base board or film-shaped base board by forming a copper foil pattern in a predetermined pattern by printing or vapor deposition, as described in Patent Document 1 (Japanese Patent Laid-open No. 2013-186784), for example.

In this case, in disposing the plurality of electrode conductors on the sheet-shaped base board or film-shaped base board, the sheet-shaped base board or film-shaped base board is formed with through-holes, and both a front surface and a back surface of the sheet-shaped base board or film-shaped base board are used, in order to avoid overlapping of the electrode conductors.

Therefore, the formation of the through-holes in the sheet-shaped base board or film-shaped base board and the formation of an electrode pattern by use of both surfaces are required, which leads to a high cost. Especially, in the case of a large type position detection sensor, the cost is further raised.

On the other hand, a method for producing a position detection sensor inexpensively is disclosed in Patent Document 2 (Japanese Patent Laid-open No. 1995-253840). In the method described in Patent Document 2, guide pins (wiring pins) are preliminarily disposed on a flat plate so as to enable formation of a predetermined electrode conductor pattern, and wiring is conducted while hitching a covered lead wire (insulated sensor wire) sequentially on the guide pins and bending back the covered lead wire, whereby the electrode conductor pattern is formed.

PRIOR ART DOCUMENTS

Patent Documents

Patent Document 1: Japanese Patent Laid-open No. 2013-186784
Patent Document 2: Japanese Patent Laid-open No. 1995-253840

BRIEF SUMMARY

Technical Problems

However, in Patent Document 2, the position detection sensor formed does not have a terminal, and the covered lead wires constituting the electrode conductors are simply extended from a flat plate and led out as lead portions. For connection of the respective ones of the plurality of electrode conductors of the position detection sensor with an external circuit, therefore, it is necessary to peel off the covering of the covered lead wires at the lead portions and to solder the respective lead wires, which needs a lot of labor and is unsuited to mass production.

The present disclosure has been made in consideration of the above-mentioned problems. It is an object of the present disclosure to provide a position detection sensor and a method of manufacturing the same with which it is possible to reduce costs by wiring using covered lead wires and which is provided with a terminal to enable easy connection with an external circuit.

Technical Solution

In order to solve one or more of the above-mentioned problems, according to the present disclosure, there is provided a position detection sensor including:

a substrate;

a terminal which is formed on one surface of the substrate and in which a plurality of terminal conductors is disposed;

a sensor pattern in which a plurality of electrode conductors including covered lead wires are disposed in a region on the one surface of the substrate that does not overlap the terminal, the plurality of electrode conductors being bonded to the substrate by an adhesive material in a predetermined conductor pattern, respective ends of the covered lead wire of the plurality of electrode conductors, the exposed lead wires being disposed while being aligned with and connected to corresponding ones of terminal conductors of the terminal; and a protective sheet disposed on the sensor pattern disposed on the adhesive material on the substrate, the protective sheet being bonded to the substrate by the adhesive material, with the sensor pattern sandwiched therebetween.

In the position detection sensor according to the present disclosure, the terminal is preliminarily formed on the substrate. In addition, in an area of the substrate that does not overlap the terminal, the sensor pattern is configured by disposing the plurality of electrode conductors in such a manner that the covered lead wires form a predetermined conductor pattern, and lead wire portions being exposed due to a covering at ends of the covered lead wires being removed and aligned to be connectable with the corresponding ones of the terminal conductors formed in the terminal.

Therefore, the ends corresponding to the lead portions of the plurality of electrode conductors of the sensor pattern have the lead wires exposed and put in a state of being connectable with the terminal conductors of the terminal, for example, being positioned respectively on the terminal conductors of the terminal. Accordingly, for example, the ends of the plurality of the electrode conductors of the sensor pattern that are positioned on the terminal conductors of the terminal can easily be electrically connected respectively to the terminal conductors of the terminal.

Besides, according to the position detection sensor according to the present disclosure, the terminal is provided, so that, even though the electrode conductors are configured using the covered lead wires, the connection of the position detection sensor with an external circuit can be performed extremely easily by use of the terminal.

In addition, according to the present disclosure, there is provided a method of manufacturing a position detection sensor, including:

disposing a plurality of electrode conductors including covered lead wires in a predetermined conductor pattern, including disposing respective ends of the covered lead wires of the plurality of electrode conductors while aligning the respective ends with corresponding ones of a plurality of terminal conductors of a terminal, to form a sensor pattern;

pressing a substrate, with the plurality of the terminal conductors of the terminal formed thereon, against the sensor pattern, with an adhesive material therebetween, to bond the sensor pattern to the substrate; and electrically connecting respective ends of the electrode conductors of the sensor pattern and corresponding ones of the terminal conductors of the terminal.

In the method of manufacturing the position detection sensor of the present disclosure, the sensor pattern including the plurality of electrode conductors is formed using the covered lead wires. In this instance, the respective ends of the plurality of electrode conductors have lead wires exposed by removing (e.g., peeling off) the covering of the covered lead wires, and are preliminarily led out in a state of being aligned with the positions of the terminal conductors of the terminal.

Next, a substrate on which a terminal formed therein with terminal conductors to be connected to respective ends of electrode conductors is preliminarily formed is pressed against a sensor pattern, with an adhesive material therebetween, in a state in which the terminal conductors of the terminal are aligned to the positions of the respective ends of the plurality of electrode conductors of the sensor pattern, whereby the sensor pattern is bonded to the substrate.

Subsequently, the respective ends of the electrode conductors of the sensor pattern and the respective terminal conductors of the terminal are electrically connected. In the case of this electrical connection, since the respective ends of the electrode conductors of the sensor pattern and the respective terminal conductors of the terminal are in the state of being aligned, the ends of the plurality of electrode conductors of the sensor pattern that are positioned on the terminal conductors can easily be electrically connected to the respective terminal conductors of the terminal.

Advantageous Effects

According to the present disclosure, it is possible to provide a position detection sensor with which it is possible to reduce costs by wiring using covered lead wires and which is provided with a terminal to enable easy connection with an external circuit.

According to the method of manufacturing the position detection sensor according to the present disclosure, a position detection sensor with which it is possible to reduce costs by wiring using covered lead wires and which is provided with a terminal to enable easy connection with an external circuit can be manufactured by a comparatively simple method which also enables mass production.

BRIEF DESCRIPTION OF DRAWINGS

FIG. 8 is a figure depicting a flow chart for explaining the flow of a method of manufacturing the position detection sensor according to an embodiment of the present disclosure.

MODES FOR CARRYING OUT THE DISCLOSURE

Figure 1:
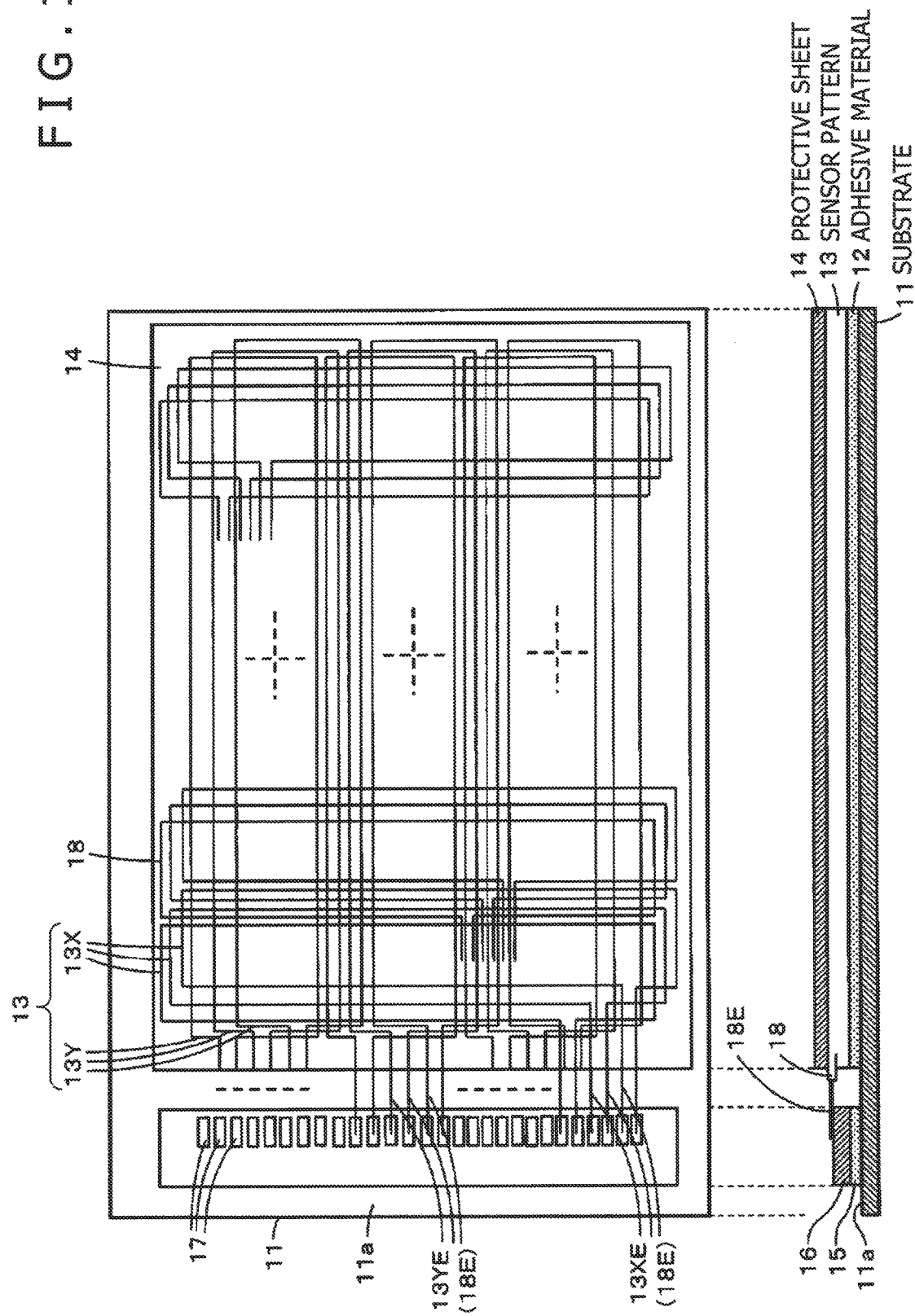
FIG. 1 is a figure for explaining a configuration example of a position detection sensor according to an embodiment of the present disclosure.

An embodiment of a position detection sensor and an embodiment of a method of manufacturing the position detection sensor, according to the present disclosure, will be described below referring to the drawings.

Embodiment of Position Detection Sensor

The embodiment of the position detection sensor described below is a position detection sensor of an electromagnetic induction type, wherein the pattern of each of a plurality of electrode conductors constituting a sensor pattern is a loop coil pattern.

FIG. 1 is a figure for explaining the configuration of a position detection sensor 1 in this embodiment, wherein the upper portion of FIG. 1 is a view of a surface formed with a sensor pattern of the position detection sensor 1, as viewed in a direction orthogonal to the surface, and the lower portion of FIG. 1 is a conceptual view of the configuration of a section of the position detection sensor 1.

In the position detection sensor 1 in this embodiment, as depicted in FIG. 1, a sensor pattern 13 included of a plurality of loop coils as a plurality of electrode conductors is disposed on, and bonded by an adhesive material 12 to, one surface 11a of a rectangular sheet-shaped or film-shaped substrate (base board) 11 formed of an insulating material, for example, polyethylene terephthalate (PET). In addition, a rectangular protective sheet 14 formed of an insulating material, for example, PET, is disposed in such a manner as to cover the whole of the sensor pattern 13. The sensor pattern 13 has spaces in areas other than the electrode conductor portions; therefore, the protective sheet 14 is bonded by adhesion to the substrate 11 by the adhesive material 12 through the space portions of the sensor pattern 13.

Besides, in an area of an end edge portion on the one surface 11a of the substrate 11 that does not overlap the region where the sensor pattern 13 is disposed, a terminal 16 is bonded to the one surface 11a through an adhesive material 15. The terminal 16 has a configuration wherein terminal conductors 17 for respective electrical connection with the plurality of electrode conductors of the sensor pattern 13 are formed, for example, by printing of a copper foil pattern, on a sheet-shaped or film-shaped base board formed from an insulating material, for example, PET. In this embodiment, an upper portion of the terminal 16 is not covered with the protective sheet 14.

The sensor pattern 13 includes a plurality of loop coils as an example of a plurality of electrode conductors, as depicted in FIG. 1; in this example, the plurality of loop coils are composed of a plurality of X-axis direction loop coils 13X and a plurality of Y-axis direction loop coils 13Y.

The X-axis direction loop coil 13X is composed of a rectangular loop coil of which the long side direction is set in a longitudinal direction of the substrate 11 (for example, a Y-axis direction of position coordinates), and a plurality of the X-axis direction loop coils 13X are arranged at predetermined intervals in a transverse direction of the substrate 11 (for example, an X-axis direction of the position coordinates). In addition, the Y-axis direction loop coil 13Y is composed of a rectangular loop coil of which the long side direction is set in the transverse direction of the substrate 11 (the X-axis direction of the position coordinates), and a plurality of the Y-axis direction loop coils are arranged at predetermined intervals in the longitudinal direction of the substrate 11 (the Y-axis direction of the position coordinates).

In this embodiment, the plurality of X-axis direction loop coils 13X and the plurality of Y-axis direction loop coils 13Y constituting the sensor pattern 13 are disposed on the one surface 11a of the substrate 11, with mutual overlapping allowed, by the covered lead wires 18. In this case, as depicted in FIG. 1, in this embodiment, each of the X-axis direction loop coils 13X and the Y-axis direction loop coils 13Y is disposed at a predetermined position on the one surface 11a of the substrate 11 in such a manner as to be in a predetermined pattern.

In this instance, both ends 18E of each of the X-axis direction loop coils 13X and the Y-axis direction loop coils 13Y are at predetermined positions on the one surface 11a of the substrate 11; as depicted in FIG. 1, both ends 18E protrude from the protective sheet 14 and are positioned in such a manner as to be just positioned on the corresponding terminal conductors 17 of the terminal 16 that are prescribed to be connected with both ends 18E. In this case, both ends 18E of each of the X-axis direction loop coils 13X and the Y-axis direction loop coils 13Y are in a state in which the lead wires are exposed by peeling off the covering of the covered lead wires, and the exposed lead wires are positioned on the terminal conductors 17 of the terminal 16.

Though not illustrated in the drawing, each of the terminal conductors 17 of the terminal 16 and both ends 18E of each of the X-axis direction loop coils 13X and the Y-axis direction loop coils 13Y are electrically connected by soldering, for example. For instance, a solder is preliminarily placed on each of the terminal conductors 17 of the terminal 16, and the solder of each of the terminal conductors 17 of the terminal 16 where both ends 18E of each of the X-axis direction loop coils 13X and the Y-axis direction loop coils 13Y are positioned is heated, whereby each of the terminal conductors 17 of the terminal 16 and both ends 18E of the X-axis direction loop coils 13X and the Y-axis direction loop coils 13Y are soldered.

As has been described above, in the position detection sensor 1 in this embodiment, the sensor pattern 13 included of the X-axis direction loop coils 13X and the Y-axis direction loop coils 13Y is formed using the covered lead wires 18, and the sensor pattern 13 is attached between the substrate 11 and the protective sheet 14 by the adhesive material 12. Therefore, the position detection sensor 1 can be manufactured at low cost.

Besides, in the position detection sensor 1 in the aforementioned embodiment, the terminal 16 in which the terminal conductors 17 are formed is preliminarily formed on one surface of the substrate 11. In addition, covering at both ends 18E of the lead wires 18 of the loop coils of the sensor pattern 13 disposed in a region on the substrate 11 that does not overlap the terminal 16 is peeled off to expose the lead wire portions, and the exposed lead wire portions of both ends 18E are disposed while being aligned in such a manner as to be connectable with the corresponding ones of the terminal conductors 17 of the terminal 16.

Therefore, the terminal conductors 17 of the terminal 16, and both ends 18E included of the exposed lead wires of each of the X-axis direction loop coils 13X and the Y-axis direction loop coils 13Y of the sensor pattern 13 can easily be electrically connected to each of the corresponding terminal conductors 17 of the terminal 16 by soldering.

In the above-mentioned way, according to the position detection sensor according to the present disclosure, the electrode conductors are composed of the covered lead wires, so that a position detection sensor which is inexpensive and simple in configuration can be provided, and the connection of the position detection sensor with an external circuit is effectively much facilitated by use of the terminal.

In Regard of Position Detection Circuit Using Position Detection Sensor of Embodiment Now, a configuration example of a position detection circuit 2 of an electromagnetic induction type that detects a position indicated by a pen-type position indicator by use of the position detection sensor 1 of the aforementioned embodiment will be described below, using FIG. 2. Note that as depicted in FIG. 2, the pen-type position indicator 3 to be used with the position detection sensor 1 in this embodiment incorporates a resonance circuit composed of a coil 31 and a capacitor 32 connected in parallel to the coil 31.

Figure 2:
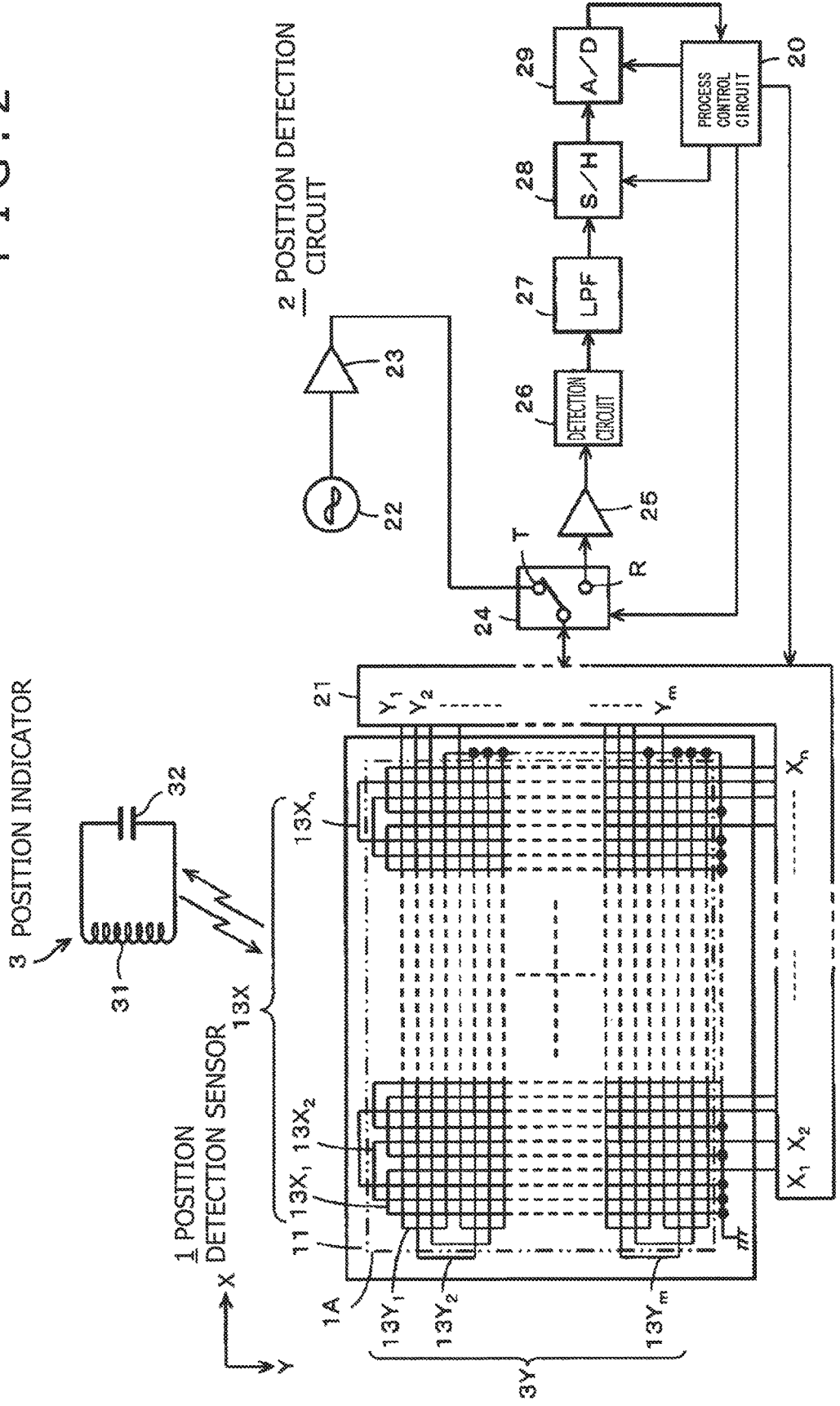
FIG. 2 is a figure for explaining a configuration example of a position detection circuit connected to the position detection sensor according to an embodiment of the present disclosure.

In this case, in the example of FIG. 2, the X-axis direction loop coils 13X are composed of n (n is an integer of equal to or not less than two) rectangular loop coils $13X_1$ to $13X_n$ arranged in the X-axis direction, and the Y-axis direction loop coils 13Y are composed of m (m is an integer of equal to not less than two) loop coils $13Y_1$ to $13Y_m$ arranged in the Y-axis direction. In this position detection sensor 1, a position detection area 1A is configured by the plurality of X-axis direction loop coils 13X and the plurality of Y-axis direction loop coils 13Y.

The position detection sensor 1 is connected to the position detection circuit 2 through the terminal 16. The position detection circuit 2 includes a selection circuit 21, an oscillator 22, a current driver 23, a transmission/reception switching circuit 24, a reception amplifier 25, a detection circuit 26, a low pass filter 27, a sample hold circuit 28, an analog to digital (A/D) conversion circuit 29 and a process controller circuit 20 (e.g., a microprocessor).

The X-axis direction loop coils $13X_1$ to $13X_n$ and the Y-axis direction loop coils $13Y_1$ to $13Y_m$ are connected to the selection circuit 21. The selection circuit 21 sequentially selects one loop coil of the X-axis direction loop coils $13X_1$ to $13X_n$ and the Y-axis direction loop coils $13Y_1$ to $13Y_m$, according to a control command from the process controller circuit 20.

The oscillator 22 generates an alternating current (AC) signal of a frequency f0. The AC signal is supplied to the current driver 23, where it is converted into a current, and the current is sent to the transmission/reception switching circuit 24. Under control by the process controller circuit 20, the transmission/reception switching circuit 24 switches a connection destination (a transmission-side terminal T, a reception-side terminal R) to which a loop coil selected by the selection circuit 21 is to be connected, every predetermined time. The current driver 23 is connected to the transmission-side terminal T, whereas the reception amplifier 25 is connected to the reception-side terminal R.

Therefore, at the time of transmission, the AC signal from the current driver 23 is supplied to the loop coil selected by the selection circuit 21, through the transmission-side terminal T of the transmission/reception switching circuit 24. In addition, at the time of reception, an induced voltage generated in the loop coil selected by the selection circuit 21 is supplied through the selection circuit 21 and the reception-side terminal R of the transmission/reception switching circuit 24 to the reception amplifier 25, where it is amplified, and the amplified voltage is sent to the detection circuit 26.

A signal detected by the detection circuit 26 is supplied through the low pass filter 27 and the sample hold circuit 28 to the A/D conversion circuit 29, where the analog signal is converted into a digital signal, and the digital signal is supplied to the process controller circuit 20.

The process controller circuit 20 performs a control process for position detection. Specifically, the process controller circuit 20 controls selection of the loop coil in the selection circuit 21, signal switching control in the transmission/reception switching circuit 24, timing in the sample hold circuit 28, etc.

By switching the transmission/reception switching circuit 24 for connection to the transmission-side terminal T, the process controller circuit 20 applies energization control to the loop coil selected by the selection circuit 21 from among the X-axis direction loop coils $13X_1$ to $13X_n$ and the Y-axis direction loop coils $13Y_1$ to $13Y_m$, thereby causing the loop coil to output an electromagnetic wave. Receiving the electromagnetic wave outputted from the loop coil, the resonance circuit of the position indicator 3 accumulates energy.

Next, the process controller circuit 20 switches the transmission/reception switching circuit 24 for connection to the reception-side terminal R. Upon this switching, an induced voltage is generated in each loop coil of the X-axis direction loop coils $13X_1$ to $13X_n$ and the Y-axis direction loop coils $13Y_1$ to $13Y_m$, by the electromagnetic wave transmitted from the position indicator 3. On the basis of the level of the voltage value of the induced voltage generated in each loop coil, the process controller circuit 20 calculates coordinate values of an indicated position in the X-axis direction and the Y-axis direction in the position detection area 1A of the position detection sensor 1. Then, the process controller circuit 20 supplies information of the calculated coordinate values to, for example, an external personal computer.

Embodiment of Method of Manufacturing Position Detection Sensor 1 of Embodiment Now, an embodiment of the method of manufacturing the position detection sensor 1 of the configuration depicted in FIG. 1 will be described below.

First Embodiment of Method of Manufacturing Position Detection Sensor

Figure 3:
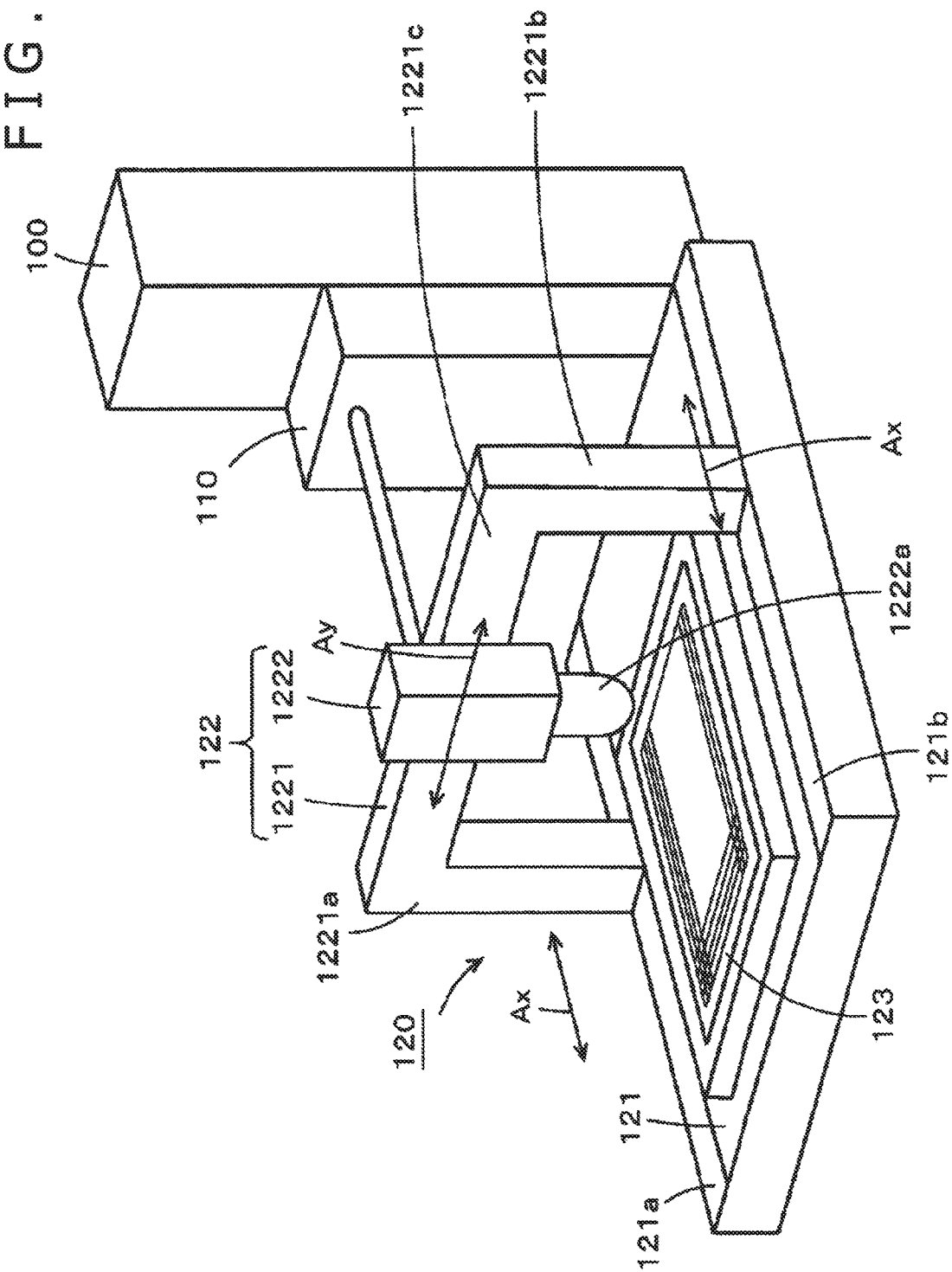
FIG. 3 is a figure for explaining an example of a manufacturing apparatus for manufacturing the position detection sensor according to an embodiment of the present disclosure.
Figure 4:
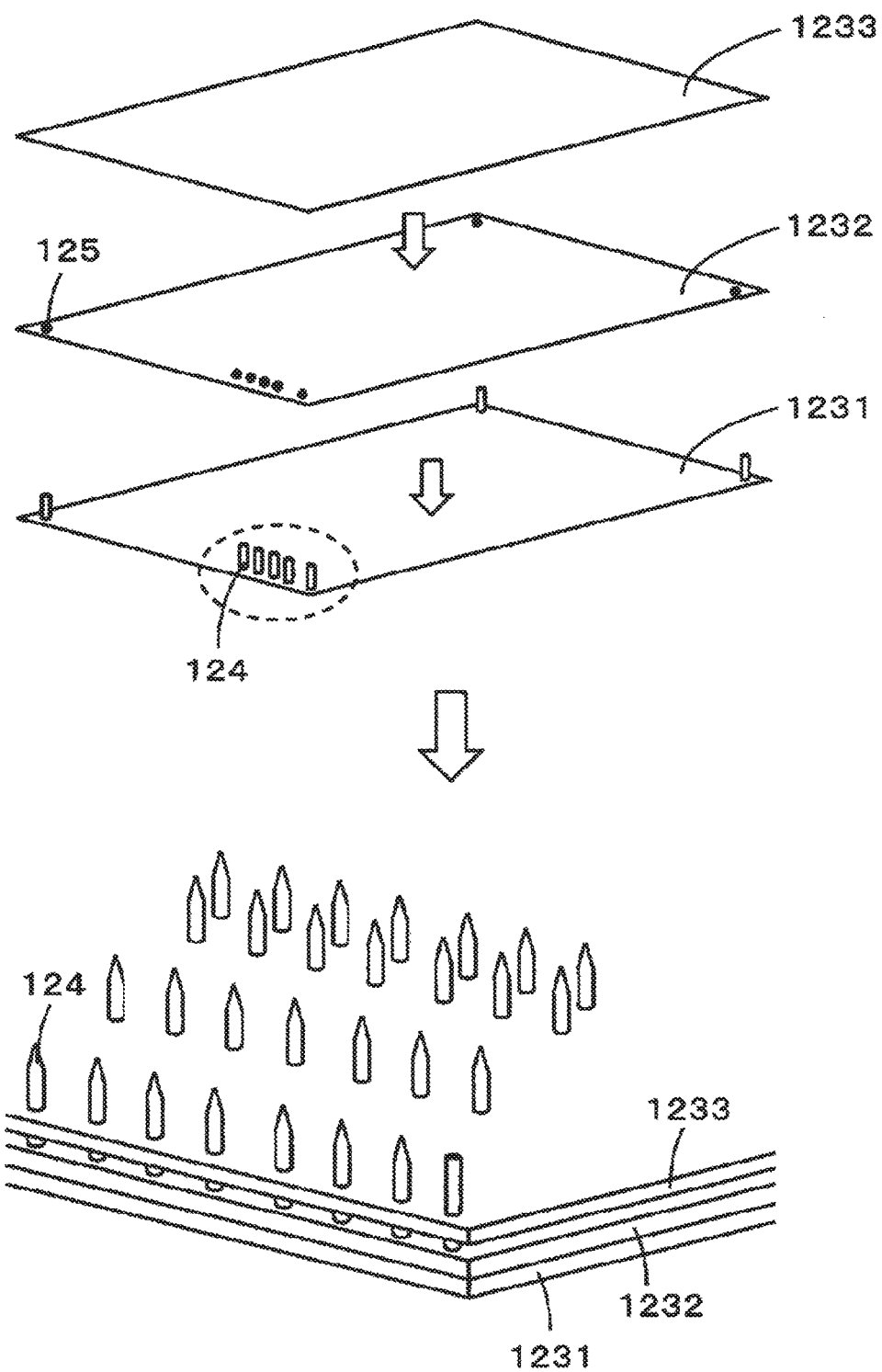
FIG. 4 is a figure used for explaining a method of manufacturing a position detection sensor according to an embodiment of the present disclosure.

FIGS. 3 and 4 are figures for explaining a first embodiment of the method of manufacturing the position detection sensor 1. FIG. 3 is a figure depicting a configuration example of a position detection sensor manufacturing apparatus for carrying out the manufacturing method of the first embodiment. The position detection sensor manufacturing apparatus in this example includes a wiring supply unit 100, a pretreatment unit 110, and a wiring unit 120.

The wiring unit 120 includes a workbench 121 for forming the position detection sensor 1, and a biaxially moving wiring device 122 provided on the workbench 121. The biaxially moving wiring device 122 includes a moving bridge 1221 which performs sliding movement in an X-axis direction (see the direction of arrow Ax in FIG. 3) of the position detection sensor 1, and a wiring nozzle mechanism 1222 which performs sliding movement in a Y-axis direction (see the direction of arrow Ay in FIG. 3) of the position detection sensor 1.

The moving bridge 1221 includes two leg portions 1221a and 1221b, and a bridging portion 1221c bridging between the two leg portions 1221a and 1221b while straddling the position detection sensor 1 in a direction along the Y-axis direction of the latter. The two leg portions 1221a and 1221b of the moving bridge 1221 are mounted respectively on two rails 121a and 121b provided in the X-axis direction on the workbench 121, and the moving bridge 1221 performs sliding movement in the X-axis direction while being guided by the two rails 121a and 121b, with the bridging portion 1221c kept in a state of being parallel to the Y-axis direction.

The wiring nozzle mechanism 1222 is so mounted as to be movable in the bridging direction (the Y-axis direction (see the direction of arrow Ay in FIG. 3) of the position detection sensor 1), in relation to the bridging portion 1221c of the moving bridge 1221. A wiring nozzle 1222a is mounted to that portion of the wiring nozzle mechanism 1222 which faces a surface of the workbench 121. The wiring nozzle 1222a delivers a covered lead wire having undergone a pretreatment conducted by the pretreatment unit 110, from its ejection port to the exterior.

This configuration enables the wiring nozzle 1222a to be moved in an arbitrary direction on a two-dimensional plane of the workbench 121, through the sliding movement in the X-axis direction of the moving bridge 1221 and the sliding movement in the Y-axis direction of the wiring nozzle mechanism 1222, in the biaxially moving wiring device 122.

The biaxially moving wiring device 122 has a movement controller (e.g., microprocessor) which is omitted in the drawing in FIG. 3, wherein the sliding movement in the X-axis direction of the moving bridge 1221 and the sliding movement in the Y-axis direction of the wiring nozzle mechanism 1222 are controlled by the movement controller. In this embodiment, the movement controller preliminarily stores therein information of moving paths along which to move the wiring nozzle 1222a in such a manner as to dispose each of the plurality of X-axis direction loop coils 13X and each of the plurality of Y-axis direction loop coils 13Y.

On the basis of the information stored, the movement controller of the biaxially moving wiring device 122 controls the sliding movement in the X-axis direction of the moving bridge 1221 and the sliding movement in the Y-axis direction of the wiring nozzle mechanism 1222, thereby controlling the movement of the wiring nozzle 1222a in such a manner as to dispose each of the plurality of X-axis direction loop coils 13X and each of the plurality of Y-axis direction loop coils 13Y.

The workbench 121 of the wiring unit 120 is provided with a pin table 123 on which guide pins for such guiding as to form the X-axis direction loop coils 13X and the Y-axis direction loop coils 13Y as patterns by use of covered lead wires are disposed.

FIG. 4 is a figure for explaining a configuration example of the pin table 123. As depicted in the upper part of FIG. 4, the pin table 123 includes a guide pin mounting plate 1231, an intermediate plate 1232, and a release sheet 1233. The pin table 123 is configured by a method wherein the guide pin mounting plate 1231, the intermediate plate 1232, and the release sheet 1233 are combined in the manner as depicted in the lower part of FIG. 4. Note that the figure of the pin table 123 in the lower part of FIG. 4 is an enlarged view of the region corresponding to the region surrounded by a broken line in the figure in the upper part of FIG. 4.

A multiplicity of guide pins 124 for such guiding as to form each of the plurality of X-axis direction loop coils 13X and each of the plurality of Y-axis direction loop coils 13Y by use of the covered lead wire discharged from the wiring nozzle 1222a are mounted to the guide pin mounting plate 1231. In FIG. 4, the guide pins 124 are depicted in the manner of being mounted only at an end portion of the guide pin mounting plate 1231, for convenience of explanation. Actually, however, the guide pins 124 are provided at least at each of point positions for bending each of the plurality of X-axis direction loop coils 13X and each of the plurality of Y-axis direction loop coils 13Y.

The intermediate plate 1232 is provided between the guide pin mounting plate 1231 and the release sheet 1233, as depicted in FIG. 4, the intermediate plate 1232 is formed with through-holes 125 at positions corresponding respectively to the guide pins 124 provided on the guide pin mounting plate 1231.

The release sheet 1233 is provided on the intermediate plate 1232 bonded to the guide pin mounting plate 1231. In this instance, the guide pins 124 pierce through the release sheet 1233, and tips of the guide pins 124 are protruding to above the release sheet 1233. Note that in this example, the tips of the guide pins 124 are sharpened in a needle shape.

In this way, the guide pin mounting plate 1231, the intermediate plate 1232, and the release sheet 1233 are connected as depicted in the lower part of FIG. 4, whereby the pin table 123 with the multiplicity of guide pins 124 erected at predetermined positions is configured.

On the release sheet 1233 of the pin table 123, each of the plurality of X-axis direction loop coils 13X and the plurality of Y-axis direction loop coils 13Y is formed in a predetermined loop coil pattern by use of the covered lead wire delivered from the wiring nozzle 1222a of the wiring nozzle mechanism 1222, whereby the sensor pattern 13 is formed. A surface of the release sheet 1233 has been processed in such a manner that the sensor pattern 13 formed can be easily peeled off or released from the pin table 123.

Using the position detection sensor manufacturing apparatus having the configuration as above-mentioned, the position detection sensor 1 is manufactured in the procedure as described below. Note that the position detection sensor manufacturing apparatus of FIG. 3 performs sequential control of respective operations of the wiring supply unit 100, the pretreatment unit 110, and the wiring unit 120 by a sequential controller which is omitted in the drawing.

Figure 5:
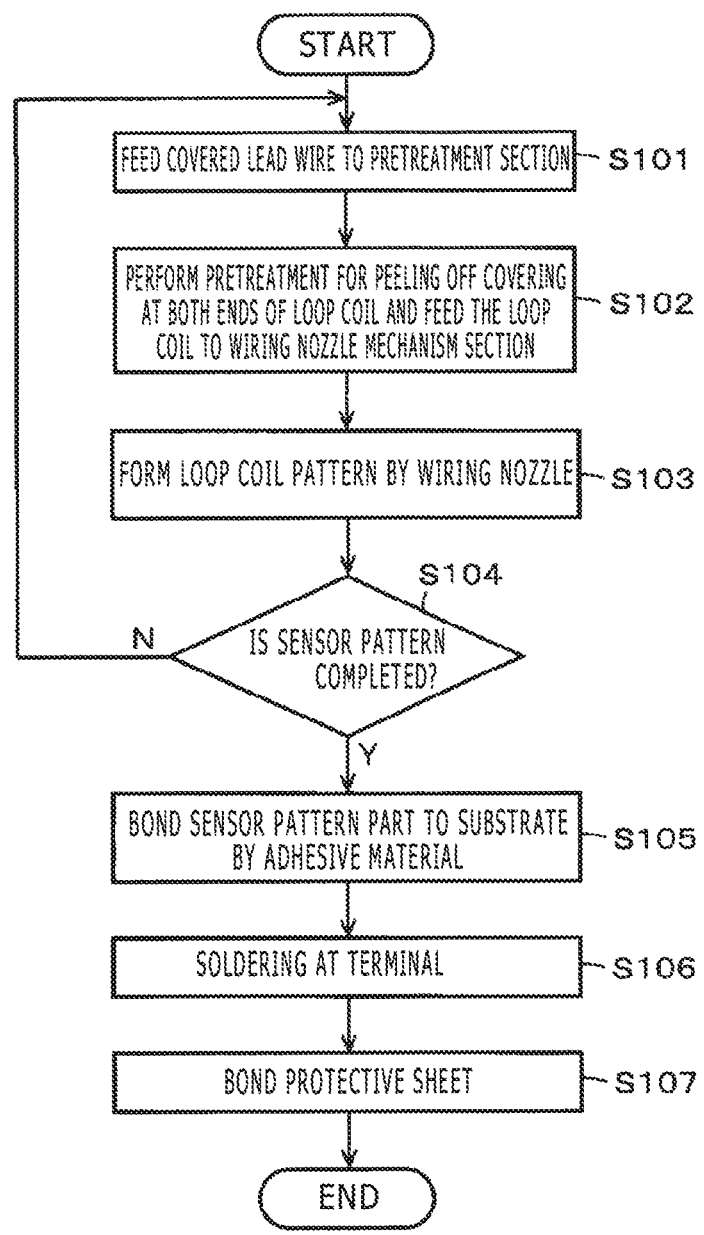
FIG. 5 is a figure depicting a flow chart for explaining the flow of the method of manufacturing the position detection sensor according to an embodiment of the present disclosure.

FIG. 5 is a flow chart for explaining the flow of acts of the method of manufacturing the position detection sensor in the first embodiment. Referring to FIG. 5, the position detection sensor manufacturing method in this embodiment will be described. Note that the processing in each of the following acts is carried out under control of the sequential controller of the position detection sensor manufacturing apparatus.

First, the sequential controller gives a command that causes the covered lead wire 18 from the wiring supply unit 100 to be delivered to the pretreatment unit 110 (S101). At the pretreatment unit 110, a pretreatment process is conducted wherein the covered lead wire 18 delivered from the wiring supply unit 100 is cut to a length conforming to each of the X-axis direction loop coils 13X or the Y-axis direction loop coils 13Y, and the covering at both ends of the X-axis direction loop coil 13X or the Y-axis direction loop coil 13Y is peeled off to expose the lead wire. Then, the pretreatment unit 110 feeds the pretreated covered lead wire 18 to the wiring nozzle mechanism 1222 of the wiring unit 120 (S102). Note that only the treatment of peeling off the covering of the covered lead wire 18 to expose the lead wire may be conducted at the pretreatment unit 110, and the treatment of cutting the pretreated covered lead wire 18 to a length conforming to each of the X-axis direction loop coils 13X or the Y-axis direction loop coils 13Y may be performed at the wiring nozzle mechanism 1222 of the wiring unit 120.

Figure 6:
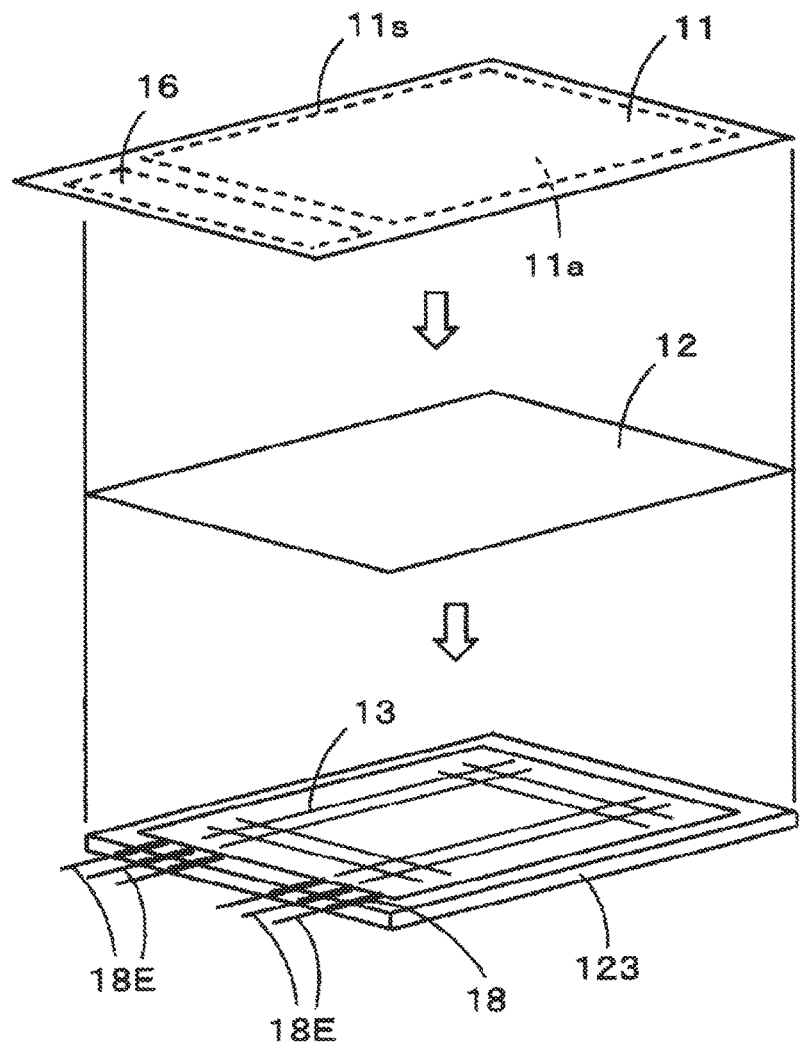
FIG. 6 is a figure used for explaining the method of manufacturing the position detection sensor according to an embodiment of the present disclosure.

The wiring unit 120 controls movement of the wiring nozzle 1222a of the wiring nozzle mechanism 1222 by the movement controller of the biaxially moving wiring device 122, so as thereby to form each of the X-axis direction loop coils 13X or the Y-axis direction loop coils 13Y while hitching the covered lead wire 18 on the guide pins on the pin table 123 (S103). In this case, both ends 18E, where the covering of the covered lead wire 18 has been peeled off to expose the lead wire, of the X-axis direction loop coil 13X or the Y-axis direction loop coil 13Y are protruded in the X-axis direction from the pin table 123 as illustrated in FIG. 6. The positions of both ends 18E are in the state of being aligned such as to be positioned on the corresponding terminal conductors 17 of the terminal 16, as depicted in the above description referring to FIG. 1, due to the covered lead wire 18 being disposed while being guided by the guide pins 124.

When formation of one X-axis direction loop coil 13X or Y-axis direction loop coil 13Y is finished, the sequential controller determines whether or not the formation of the plurality of X-axis direction loop coils 13X and the plurality of Y-axis direction loop coils 13Y is finished on the pin table 123 and the sensor pattern 13 is completed (S104).

If it is determined at S104 that the sensor pattern 13 is not yet completed, the sequential controller returns the process to S101, and performs such control to apply the same processing as applied at S101 to S103 to each of the plurality of X-axis direction loop coils 13X or the plurality of Y-axis direction loop coils 13Y.

If it is determined at S104 that the sensor pattern 13 is completed, the substrate 11 is alignedly pressed against the sensor pattern 13 on the pin table 123 through an adhesive material 12 composed of a double-sided tape, for example, whereby the sensor pattern 13 on the pin table 123 is bonded to the substrate 11 by the adhesive material 12, as depicted in FIG. 6 (S105).

In this case, as depicted in FIG. 6, the terminal 16 in which a plurality of terminal conductors 17 (omitted in FIG. 6; see FIG. 1) are formed is preliminarily bonded to the surface 11a of the substrate 11 that faces the pin table 123. In this embodiment, as depicted in FIG. 1, the substrate 11 has a region 11s (see the region indicated by a broken line in FIG. 6) of sensor pattern, as a region exclusive of a region where the terminal 16 is formed.

In this embodiment, the double-sided tape constituting the adhesive material 12 has a size corresponding to the size of the region 11s of sensor pattern, and, in this example, such a positioning is conducted that the adhesive material 12 is absent on the region where the terminal 16 is formed. The substrate 11 is pressed against the pin table 123 through the adhesive material 12, while being positioned in such a manner that the sensor pattern 13 of the pin table 123 corresponds to the region 11s of the sensor pattern 13.

The positioning of the double-sided tape as the adhesive material 12 and the substrate 11 is conducted by predetermined ones (for examples, those ones which are located in four corners of the region 11s) of the guide pins 124 protruding to above the pin table 123. Note that the adhesive material 12 may be preliminarily bonded to the region 11s of the substrate 11.

On the other hand, as depicted in FIG. 6, the sensor pattern 13 on the pin table 123 is protruding in the direction from the region 11s of the sensor pattern 13 toward the terminal 16 in such a manner that both ends 18E, where the lead wire is exposed, of each of the plurality of X-axis direction loop coils 13X or the plurality of Y-axis direction loop coils 13Y are connected to the corresponding terminal conductors 17 of the terminal 16.

Figure 7:
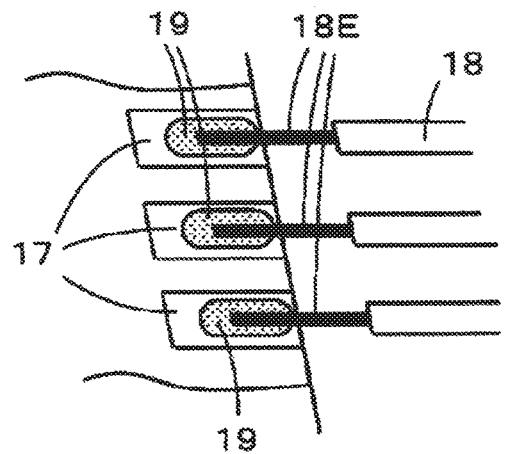
FIG. 7 is a figure used for explaining the method of manufacturing the position detection sensor according to an embodiment of the present disclosure.

When the one surface 11a of the substrate 11 is alignedly pressed against the pin table 123 in this way, the guide pins 124 pierce through the substrate 11, and the sensor pattern 13 is bonded to the region 11s of the substrate 11 by the adhesive material 12. Then, as depicted in FIG. 7, both ends 18E, where the covering of the covered lead wire 18 is peeled off and the lead wire is exposed, of each of the plurality of X-axis direction loop coils 13X or the plurality of Y-axis direction loop coils 13Y are positioned on the corresponding terminal conductors 17 of the terminal 16.

When the sensor pattern 13 is bonded to the one surface 11a of the substrate 11 by the adhesive material 12 in this way, the substrate 11 is peeled off or released from the pin table 123, at S105. In this case, by a lifting-up mechanism using a robot hand or the like (omitted in the drawing), the substrate 11 is separated and lifted up from the pin mounting plate 1231, together with the part of the intermediate plate 1232 and the release sheet 1233, and released from the guide pins 124. Note that a method may be adopted wherein instead of lifting up the substrate 11 together with the part of the intermediate plate 1232 and the release sheet 1233, the pin mounting plate 1231 is lowered downward by an amount of not less than the height of the guide pins, in a state in which the substrate 11 is maintained together with the part of the intermediate plate 1232 and the release sheet 1233, by a robot hand or the like (omitted in the drawing), whereby the substrate 11 is released from the guide pins 124.

Thereafter, the substrate 11 accompanied by the release sheet 1233, released from the guide pins 124, is reversed face side back, and is mounted on a mount table (omitted in the drawing) different from the pin table 123. Then, the release sheet 1233 is peeled off or released from the sensor pattern 13 bonded to the one surface 11a of the substrate 11.

The sensor pattern 13 is bonded to the one surface 11a of the substrate 11 released from the pin table 123 in this way, and, as aforementioned, both ends 18E where the covering of the covered lead wire 18 is peeled off and the lead wire is exposed, of each of the plurality of X-axis direction loop coils 13X and the plurality of Y-axis direction loop coils 13Y are in the state of being positioned on the corresponding terminal conductors 17 of the terminal 16.

In this embodiment, as illustrated in FIG. 7, a solder 19 is preliminarily placed on each of the terminal conductors 17 of the terminal 16 on the one surface 11a of the substrate 11. Besides, in this embodiment, the part of the solder 19 on each terminal conductor 17 of the terminal 16 is heated to melt the solder 19, and\both ends 18E where the covering of the covered lead wire 18 is peeled off to expose the lead wire are soldered to, and thereby electrically connected to, the corresponding terminal conductors 17 of the terminal 16 (S106).

Next, in this embodiment, the protective sheet 14 (see FIG. 1) is bonded onto the sensor pattern 13 in the region 11s of the one surface 11a of the substrate 11 by an adhesive material, to cover the sensor pattern 13 (S107). By the above-mentioned acts, the position detection sensor 1 can be manufactured. Note that in the case where the position detection sensor 1 is produced by the above-mentioned acts and when the position detection sensor 1 is sized to have a surplus region on a manufacturing basis, the unrequired portion is finally cut away, to obtain a predetermined external shape.

Note that the adhesive material for bonding the protective sheet 14 may be used separately from the adhesive material 12, or the adhesive material 12 present on a part other than the sensor pattern 13 (the adhesive material 12 present not only outside of the sensor pattern 13 but also at that portion in the region of the sensor pattern 13 at which the covered lead wire for forming the loop coil pattern is absent) may be utilized as an adhesive material for adhering the protective sheet 14 to the one surface 11a of the substrate 11.

In the above-mentioned manner, according to the position detection sensor manufacturing method in this embodiment, it is possible to manufacture a position detection sensor 1 wherein a sensor pattern 13 can be easily disposed on one surface 11a of a substrate by use of covered lead wires and wherein electrical connection between terminal conductors 17 of a terminal 16 and each loop coil of the sensor pattern 13 can be easily carried out. In addition, by using the manufacturing method of this embodiment, it is possible to mass produce the position detection sensor 1.

Second Embodiment of Method of Manufacturing Position Detection Sensor

A manufacturing apparatus used in a manufacturing method according to the second embodiment differs from the manufacturing apparatus depicted in FIG. 3 in the configuration of the wiring unit 120, the other points being the same as in the first embodiment. In the second embodiment, the pin table 123 on which the guide pins 124 are formed is not used. In the second embodiment, a layer of an adhesive material 12 is provided on one surface 11a of a substrate 11, and a terminal 16 and a sensor pattern 13 are disposed on the layer of the adhesive material 12 by use of a wiring nozzle mechanism. The wiring nozzle mechanism 1222A of a wiring unit 120A in the case of this example is so configured that instead of forming the loop coil patterns in the manner of hitching the covered lead wire 18 on guide pins, a wiring nozzle 1222Aa is moved while pressing the covered lead wire 18 against the adhesive material 12 side of the one surface 11a of the substrate 11, whereby the loop coil patterns are formed. As a configuration for performing such a process, a known one can be used, and, accordingly, a configuration example is omitted here. The other points are the same as in the above-described first embodiment of the method of manufacturing the position detection sensor.

FIG. 8 is a flow chart for explaining the flow of acts of the method of manufacturing the position detection sensor according to the second embodiment. Referring to FIG. 8, the position detection sensor manufacturing method of this embodiment will be described. Note that the processing in each of the acts described below is carried out under control by a sequential controller of a position detection sensor manufacturing apparatus.

First, the sequential controller places the substrate 11 in a predetermined place on the workbench 121, and applies the adhesive material 12 to one surface 11a of the substrate 11. In this case, the adhesive material 15 for the terminal 16 in FIG. 1 is not used, and the adhesive material 12 serves also as the adhesive material 15 (S201). Next, the sequential controller mounts a preliminarily prepared terminal 16 to a predetermined position of the one surface 11a of the substrate 11, by adhesion with the adhesive material 12 (S202).

Subsequently, a command that causes the covered lead wire 18 to be delivered from the wiring supply unit 100 to the pretreatment unit 110 is given (S203). At the pretreatment unit 110, a pretreatment process is conducted wherein the covered lead wire 18 supplied from the wiring supply unit 100 is cut to a length conforming to each of the X-axis direction loop coils 13X or the Y-axis direction loop coils 13Y, and the covering at both ends of the X-axis direction loop coil 13X or the Y-axis direction loop coil 13Y is peeled off to expose the lead wire. Then, the pretreatment unit 110 feeds the pretreated covered lead wire 18 to the wiring nozzle mechanism 1222A of the wiring unit 120A (S204). Note that only the treatment of peeling off the covering of the covered lead wire 18 to expose the lead wire may be conducted at the pretreatment unit 110, and the treatment of cutting the covered lead wire 18 to the length conforming to each of the X-axis direction loop coils 13X or the Y-axis direction loop coils 13Y may be performed at the wiring nozzle mechanism 1222A of the wiring unit 120A.

The wiring unit 120A controls movement of the wiring nozzle 1222Aa of the wiring nozzle mechanism 1222A, by the movement controller of the biaxially moving wiring device 122A, and bonds the covered lead wire 18 onto the one surface 11a of the substrate 11 by the adhesive material 12, and, while doing so, forms each of the X-axis direction loop coils 13X or the Y-axis direction loop coils 13Y on the one surface 11a of the substrate 11 (S205). In this case, both ends 18E where the covering of the covered lead wire 18 is peeled off to expose the lead wire, of the X-axis direction loop coil 13X or the Y-axis direction loop coil 13Y, are in the state of being so aligned as to be positioned on the corresponding terminal conductors 17 of the terminal 16, as depicted in FIG. 7.

When the formation of one X-axis direction loop coil 13X or Y-axis direction loop coil 13Y is finished, the sequential controller determines whether or not the formation of the plurality of X-axis direction loop coils 13X and the plurality of Y-axis direction loop coils 13Y is finished and the sensor pattern 13 is completed (S206).

If it is determined at S206 that the sensor pattern 13 is not yet completed, the sequential controller returns the process to S203, and performs such control as to apply the same processing as applied at S203 to S205 to each of the plurality of X-axis direction loop coils 13X and the Y-axis direction loop coils 13Y.

If it is determined at S206 that the sensor pattern 13 is completed, both ends 18E where the covering of the covered lead wire 18 is peeled off to expose the lead wire are in the state of being positioned on the corresponding terminal conductors 17 of the terminal pattern 16, as depicted in FIG. 7.

When the sensor pattern 13 is bonded to the one surface 11a of the substrate 11 by the adhesive material 12 in this way, the part of the solder 19 placed on each terminal conductor 17 of the terminal 16 is heated, to melt the solder 19, whereby both ends 18E where the covering of the covered lead wire 18 is peeled off to expose the lead wire, of each of the plurality of X-axis direction loop coils 13X and the plurality of Y-axis direction loop coils 13Y, are soldered to, and electrically connected to, the corresponding terminal conductors 17 of the terminal 16 (S207).

Next, in this embodiment, the protective sheet 14 (see FIG. 1) is bonded onto the sensor pattern 13 in the region 11s of the one surface 11a of the substrate 11 by an adhesive material, to cover the sensor pattern 13 (S208). By the above-mentioned acts, the position detection sensor 1 can be manufactured. Note that in the case where the position detection sensor 1 is produced by the above-mentioned acts and when the position detection sensor 1 is sized to have a surplus region on a manufacturing basis, the unrequired portion is finally cut away, to obtain a predetermined external shape.

Note that the adhesive material for bonding the protective sheet 14 may be used separately from the adhesive material 12, or the adhesive material 12 present on a part other than the sensor pattern 13 (the adhesive material 12 present not only outside of the sensor pattern 13 but also at that portion in the region of the sensor pattern 13 at which the covered lead wire for forming the loop coil pattern is absent) may be utilized as an adhesive material for adhering the protective sheet 14 to the one surface 11a of the substrate 11.

In the above-mentioned manner, according to the position detection sensor manufacturing method in this embodiment, it is possible to manufacture a position detection sensor 1 wherein a sensor pattern 13 can be easily disposed on one surface 11a of a substrate by use of covered lead wires and wherein electrical connection between terminal conductors 17 of a terminal 16 and each loop coil of the sensor pattern 13 can be easily carried out. In addition, by using the manufacturing method of this embodiment, it is possible to mass produce the position detection sensor 1.

Note that while a method of applying a layer of an adhesive material to the substrate 11 and thereafter bonding the covered lead wires to the layer of the adhesive material has been used in the aforementioned second embodiment of the position detection sensor manufacturing method, a method may be adopted wherein instead of applying the adhesive material layer, covered lead wires provided with a thermally meltable adhesive material, for example, are used as the covered lead wires, and the covered lead wires are bonded to the substrate while thermally melting the adhesive material of the covered lead wires.

Modifications of Aforementioned Embodiment

Note that while the adhesive material 15 for bonding the terminal 16 to the substrate 11 and the adhesive material 12 for bonding the sensor pattern 13 to the substrate 11 have been different from each other in the example of FIG. 1, the adhesive material 15 and the adhesive material 12 can be made to be the same adhesive material by applying an adhesive material to the whole area of the one surface 11a of the substrate 11.

In addition, in the position detection sensor 1 of the embodiment aforementioned, the terminal 16 has a configuration wherein the terminal conductors 17 for electrical connection with each of the plurality of electrode conductors of the sensor pattern 13 are formed, for example by printing of a copper foil pattern, on a sheet-shaped or film-shaped base board formed of an insulating material, for example, PET, and the terminal 16 is bonded onto the substrate 11 by an adhesive material. However, the configuration of the terminal 16 and the method of forming the terminal 16 on the substrate 11 as aforementioned are mere examples, which are not restrictive. For instance, terminal conductors 17 composed of a copper foil pattern, for example, may be formed directly on the one surface 11a of the substrate 11 by printing or the like, to thereby form the terminal.

In addition, while only the terminal conductors 17 have been formed in the terminal 16 in the aforementioned embodiment, each circuit component of the position detection circuit 2 depicted in FIG. 2 may be provided in the terminal 16, or a position detection circuit 2 formed as an integrated circuit (IC) may be provided in the terminal 16. In the case where each circuit component of the position detection circuit 2 is provided in the terminal 16 or where a position detection circuit 2 formed as an IC is provided in the terminal 16, it is sufficient that connection terminals for input/output to and from the process controller circuit 20 and connection terminals for power supply are provided as terminals for connection between the terminal of the position detection sensor 1 and an external device.

Besides, in the aforementioned embodiment, the protective sheet 14 has been bonded in such a manner as to cover only the sensor pattern 13. However, the protective sheet 14 may be bonded in such a manner as to cover not only the upper side of the sensor pattern 13 but also the upper side of the terminal 16. It is to be noted, however, that in this case, the upper side of the conductor for connection between the position detection sensor 1 and an external device, of the terminal 16, is not covered with the protective sheet 14.

Note that the process of soldering between the terminal conductors 17 of the terminal 16 and both ends of each of the plurality of X-axis direction loop coils 13X or the plurality of Y-axis direction loop coils 13Y has been conducted before bonding the protective sheet 14 so as to cover the upper side of the sensor pattern 13 by the protective sheet 14 in the aforementioned example of the manufacturing method, the process of soldering at the terminal 16 may be performed after covering the upper side of the sensor pattern 13 by the protective sheet 14.

Besides, in the aforementioned embodiment, each of the terminal conductors 17 of the terminal 16 and both ends of each of the plurality of X-axis direction loop coils 13X or the plurality of Y-axis direction loop coils 13Y have been electrically connected by soldering. In the case where the upper side of the terminal conductors 17 of the terminal 16 is also covered with the protective sheet 14 by use of the adhesive material, however, the soldering process may be omitted, since both ends of each of the plurality of X-axis direction loop coils 13X or the plurality of Y-axis direction loop coils 13Y are pressed by the protective sheet 14 in a state in which both ends are in contact with each of the terminal conductors 17 by the protective sheet 14.

In addition, while the position detection sensor has had a rectangular external shape in the aforementioned embodiment, the external shape is not limited to the rectangular shape but may be any shape. Besides, while the substrate has had a flat surface shape, it may have a curved surface shape. In addition, the pattern shape of the loop coil is, naturally, not restricted to the rectangular shape in the embodiment described above.

In addition, while the loop coils have been arranged in pluralities in both the X-axis direction and the Y-axis direction, the loop coils may be arranged in plurality in only one direction.

Besides, while the terminal has been formed at one part of an end portion on one edge side of the substrate having the rectangular shape in the aforementioned embodiment, terminals may be formed at a plurality of parts of an end portion on one edge side, or may be formed at end portions of a plurality of edges of the substrate having the rectangular shape.

Note that in the position detection sensor manufacturing method mentioned above, the covering at covered lead wire portions constituting end portions of the electrode conductors is peeled off to expose the inside lead wires, in conformity with the pattern of the electrode conductor, by the pretreatment unit 110 prior to the formation of the sensor pattern of the covered lead wire by the wiring unit 120.

In the present disclosure, however, it is sufficient that end portions of the pattern of the electrode conductor are aligned to the corresponding terminal conductors of the terminal 16. Therefore, it is not indispensable to peel off the covering of the covered lead wire portions constituting the pattern of the electrode conductor prior to the process of forming the sensor pattern, by the pretreatment unit 110. For instance, a process of peeling off the covering of the covered lead wire portion of each of end portions of the plurality of electrode conductor patterns of the sensor pattern may be conducted after the formation of the sensor pattern. Alternatively, a method may be adopted wherein heating is conducted in a state in which covered lead wire portions of end portions of the electrode conductor patterns are in alignment with the corresponding terminal conductors of the terminal 16, whereby the covering portions of the covered lead wires are melted away to expose the lead wires, and the exposed lead wires and terminal conductors are electrically connected by a solder placed on the terminal conductors.

Other Modifications

Note that in the embodiment of the position detection sensor manufacturing method described above, the covered lead wire has been formed into predetermined pattern shapes of electrode conductors by moving the wiring nozzle mechanism of the wiring unit on a two-dimensional plane. However, a method may be adopted wherein a plurality of assemblies in which covered lead wires are formed into predetermined pattern shapes of electrode conductors are preliminarily prepared, and the electrode conductors formed in the predetermined patterns are adhered onto the substrate by an adhesive material.

In that case, the electrode conductors formed in the predetermined patterns may be bonded to the substrate one by one, or an assembly or assemblies in which a plurality of electrode conductors (which may be all of, or part of, the electrode conductors of the sensor pattern) formed in the predetermined patterns are adhered may be adhered onto the substrate. The adhesive material may be preliminarily applied onto the substrate, or an adhesive material (which may be of a thermally meltable type or may be one applied to the covered lead wires) given to the covering portions of the covered lead wires may be used.

The position detection sensor in the embodiments described above has been a position detection sensor in the case where electromagnetic induction type position detection is performed and where the electrode conductors are in loop coil patterns. However, the position detection sensor of the present disclosure is applicable not only to the position detection sensors of the electromagnetic induction type but also to position detection sensors of a capacitive coupling type or other types.

DESCRIPTION OF REFERENCE SYMBOLS

1 . . . Position detection sensor, 2 . . . Position detection circuit, 3 . . . Position indicator, 11 . . . Substrate, 12 . . . Adhesive material, 13 . . . Sensor pattern, 14 . . . Protective sheet, 15 . . . Adhesive material, 16 . . . Terminal, 17 . . . Terminal conductor, 18 . . . Covered lead wire, 18E . . . Both ends of loop coil (Lead wires exposed due to covering being peeled off)

The invention claimed is:

1. A method of manufacturing a position detection sensor, comprising:
   disposing a plurality of electrode conductors including covered lead wires in a predetermined conductor pattern, including disposing respective ends of the covered lead wires of the plurality of electrode conductors while aligning the respective ends with corresponding ones of a plurality of terminal conductors of a terminal, to form a sensor pattern, wherein the disposing of the plurality of electrode conductors includes disposing the plurality of the electrode conductors including the covered lead wires on a pin mounting plate having guide pins disposed thereon, forming the predetermined conductor pattern by use of the guide pins, and aligning the respective ends of the electrode conductors with the corresponding ones of the terminal conductors of the terminal, to thereby form the sensor pattern;
   pressing a substrate, with the plurality of the terminal conductors of the terminal formed thereon, against the sensor pattern, with an adhesive material therebetween, to bond the sensor pattern to the substrate;
   after the pressing of the substrate, separating the substrate with the sensor pattern bonded thereto from the pin mounting plate; and
   electrically connecting respective ends of the electrode conductors of the sensor pattern and the corresponding ones of the terminal conductors of the terminal.

2. The method of manufacturing the position detection sensor according to claim 1, comprising:
   bonding a protective sheet to a side of the sensor pattern which is opposite to a side of sensor pattern that is bonded to the substrate.

3. A method of manufacturing a position detection sensor, comprising:
   disposing a plurality of electrode conductors including covered lead wires in a predetermined conductor pattern, including disposing respective ends of the covered lead wires of the plurality of electrode conductors while aligning the respective ends with corresponding ones of a plurality of terminal conductors of a terminal, to form a sensor pattern;
   pressing a substrate, with the plurality of the terminal conductors of the terminal formed thereon, against the sensor pattern, with an adhesive material therebetween, to bond the sensor pattern to the substrate;
   electrically connecting respective ends of the electrode conductors of the sensor pattern and the corresponding ones of the terminal conductors of the terminal; and
   removing a covering at ends of the covered lead wire of each of the plurality of electrode conductors, to expose portions of the lead wires, prior to the disposing of the plurality of electrode conductors,
   wherein the electrically connecting of the respective ends of the electrode conductors of the sensor pattern includes electrically connecting respective exposed portions of the lead wires and the corresponding ones of the plurality of terminal conductors of the terminal.

4. The method of manufacturing the position detection sensor according to claim 3, comprising:
   bonding a protective sheet to a side of the sensor pattern which is opposite to a side of sensor pattern that is bonded to the substrate.

5. A method of manufacturing a position detection sensor, comprising:
   disposing a plurality of electrode conductors including covered lead wires in a region on a substrate having a terminal disposed therein, the terminal having a plurality of terminal conductors formed therein, the region being different from a region where the terminal is disposed, the plurality of electrode conductors being bonded to the substrate by an adhesive material to form a predetermined conductor pattern, the disposing including disposing respective ends of the electrode conductors while aligning the respective ends of the electrode conductors to be connectable with corresponding ones of the terminal conductors of the terminal, to form a sensor pattern; and
   electrically connecting respective ones of the terminal conductors of the terminal on the substrate and corresponding one of the ends of the electrode conductors of the sensor pattern; and
   removing a covering at ends of the covered lead wire of each of the plurality of electrode conductors, and exposing portions of the lead wires, prior to the disposing of the plurality of electrode conductors,
   wherein the electrically connecting of the respective ones of the terminal conductors of the terminal includes electrically connecting respective ones of the terminal conductors of the terminal and corresponding ones of the exposed portions of the lead wires of the plurality of electrode conductors of the sensor pattern.

6. The method of manufacturing the position detection sensor according to claim 5, comprising:
   bonding a protective sheet to a side of the sensor pattern which is opposite to a substrate side of the sensor pattern.

* * * * *